(12) United States Patent
Lin et al.

(10) Patent No.: US 6,803,263 B1
(45) Date of Patent: Oct. 12, 2004

(54) METHOD OF FABRICATING TFT WITH SELF-ALIGNED STRUCTURE

(75) Inventors: Hsiao-Yi Lin, Hsinchu (TW); Wei Chih Chang, Hsinchu (TW)

(73) Assignee: Toppoly Optoelectronics Corp., Chu-Nan (TW)

(*) Notice: Subject to any disclaimer, the term of this patent is extended or adjusted under 35 U.S.C. 154(b) by 36 days.

(21) Appl. No.: 10/420,453

(22) Filed: Apr. 22, 2003

(51) Int. Cl.[7] .......................... H01L 21/00; H01L 21/84
(52) U.S. Cl. .................. 438/149; 438/197; 438/299; 438/301; 438/306
(58) Field of Search .................. 438/197, 299, 438/301, 305, 306, 151, 199, 229, 232, 149

(56) References Cited

U.S. PATENT DOCUMENTS

| | | | |
|---|---|---|---|
| 6,096,642 A | * 8/2000 | Wu | 438/655 |
| 6,281,077 B1 | * 8/2001 | Patelmo et al. | 438/258 |
| 6,331,468 B1 | * 12/2001 | Aronowitz et al. | 438/287 |
| 6,566,215 B1 | * 5/2003 | Chong et al. | 438/305 |
| 2002/0132404 A1 | * 9/2002 | Chen et al. | 438/197 |
| 2002/0158289 A1 | * 10/2002 | Kim | 257/344 |

* cited by examiner

Primary Examiner—David Zarneke
Assistant Examiner—Thanh Y. Tran
(74) Attorney, Agent, or Firm—Quintero Law Office

(57) ABSTRACT

A method of fabricating a thin film transistor (TFT) with self-aligned structure. A substrate is provided, with a semiconductor layer and gate insulation layer formed in sequence thereon, followed by formation of a conductive layer on the gate insulation layer, and definition of the conductive layer to form a gate conductive layer and a dummy conductive layer. The dummy conductive layer is on both sides of the gate conductive layer and provided with a gap therebetween. A first ion implantation is performed via the gap to form a lightly doped region on the semiconductor layer thereunder, and a sacrificial layer is formed to fill the gap. The dummy conductive layer is removed. The gate conductive layer and the remaining sacrificial layer are used as a mask. Finally, a second ion implantation is performed to form a heavily doped source/drain region on the semiconductor layer.

20 Claims, 4 Drawing Sheets

US 6,803,263 B1

METHOD OF FABRICATING TFT WITH SELF-ALIGNED STRUCTURE

BACKGROUND OF THE INVENTION

1. Field of the Invention

The present invention relates to a method of fabricating thin film transistor (TFT), and more particularly, to a method of fabricating a TFT with self-aligned structure.

2. Description of the Related Art

Polysilicon thin film transistors (Poly-Si TFT) have been widely used in active matrix liquid crystal display (AMLCD) and static random access memory (SRAM) applications. One of the major problems of poly-Si TFTs is OFF-state leakage current, which causes charge loss in LCDs or high standby power dissipation in SRAMs. Seeking to solve this problem, conventional lightly doped drain (LDD) structures have been used to reduce the drain field, thereby reducing the leakage current. The conventional method of forming Poly-Si TFT with a LDD structure is shown with reference to FIGS. 1A~1B.

Firstly, as shown in FIG. 1A, a transparent insulating substrate 10 is provided, with a semiconductor layer 12 formed on a predefined surface thereof, with a gate insulating layer 14 formed covering the semiconductor layer 12.

Conventionally, a first mask process forms a patterned photoresist layer 16 on the gate insulating layer 14, and the patterned photoresist 16 is used as a mask in a heavy ion implantation 17 creating a heavily doped region 18 in the semiconductor layer 12, such that the heavily doped region 18 serves as a source/drain region.

Next, as shown in FIG. 1B, after removing the patterned photoresist 16, a second mask process is performed on the gate insulating layer 14 to determine and form a gate layer 20, the gate layer 20 covering only a part of the undoped regions of the semiconductor layer 12 to predefine the LDD position. Moreover, using gate layer 20 as a mask, a light ion implantation process 21 forms a lightly doped region 22 on the undoped region on both sides of the gate layer 20 in the semiconductor layer 12. Thus, the lightly doped region 22 serves as the LDD structure and the region of the semiconductor layer 12 covered by the gate layer 20 serves as a channel region.

However, in the conventional method of determining the position of the LDD structure, an extra photomask process is required, thus errors in alignment are easily caused by resulting shifts in the LDD structure. Excessive shifts in LDD structure can seriously affect the electrical performance of the poly-TFT.

SUMMARY OF THE INVENTION

An object of the present invention is thus to provide a method of fabricating TFT with a self-aligned structure.

The present invention only employs one photomask step to define an exact position of the gate and the LDD, thereby reducing conventional process by one photomask step and avoiding alignment errors, further improving electrical performance of the poly-Si TFT.

In order to achieve these objects, the present invention provides a method of fabricating TFT with a self-aligned structure, comprising providing a substrate with a semiconductor layer and gate insulation layer formed thereon in sequence, followed by formation of a conductive layer on the gate insulation layer, and definition of the conductive layer to form a gate conductive layer and a dummy conductive layer. The dummy conductive layer is on both sides of the gate conductive layer and is provided with a gap therebetween. Next, a first ion implantation is performed via the gap to form a lightly doped region on the semiconductor layer thereunder, and a sacrificial layer is formed to fill the gap. The dummy conductive layer is then removed. The gate conductive layer and a part of the remaining sacrificial layer are used as a mask. Finally, a second ion implantation is performed to form a heavily doped source/drain region on the semiconductor layer.

BRIEF DESCRIPTION OF THE DRAWINGS

These and other objects of the present invention can be more fully understood by reading the subsequent detailed description in conjunction with the examples and references made to the accompanying drawings, in which.

DETAILED DESCRIPTION OF THE INVENTION

FIG. 2A to 2I are schematic views showing a method for fabricating a poly-Si TFT with a self-aligned structure according to the present invention.

Figure 1A:
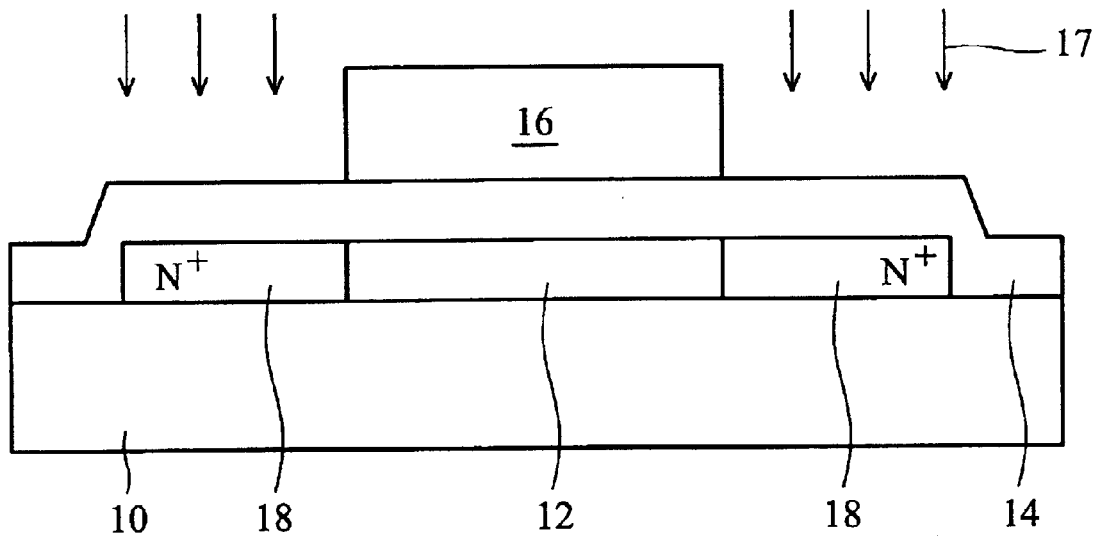
FIG. 1A and FIG. 1B are schematic views showing a method for fabricating a poly-Si TFT with a self-aligned structure according to prior art.
Figure 1B:
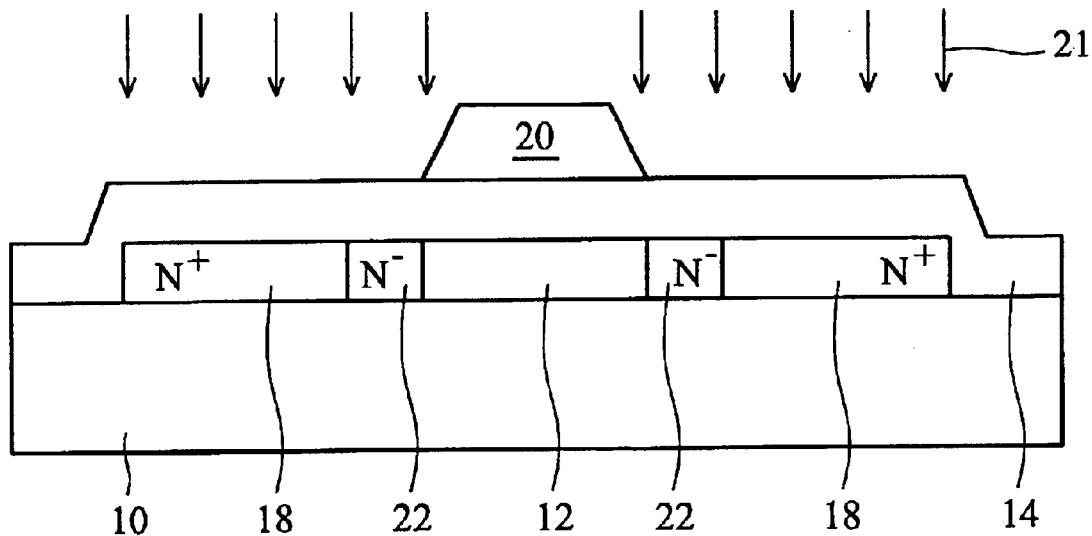
Figure 2A:
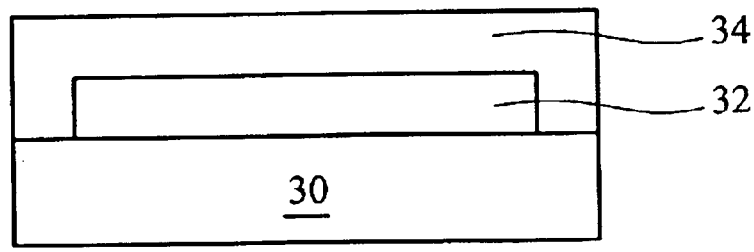
FIG. 2A to 2I are schematic views showing a method for fabricating a poly-Si TFT with a self-aligned structure according to the preferred embodiment of the present invention.

First, as shown in FIG. 2A, a transparent insulating substrate 30 and a semiconductor layer 32 (e.g., polysilicon layer) are formed on a predefined surface of a transparent insulating substrate 30, wherein the semiconductor layer 32 has a preferred thickness of about 400 to 450 Å. Moreover, a gate insulating layer 34 is formed conformally over the semiconductor layer 32 (e.g., polysilicon layer), wherein the gate insulating layer 34 is formed by siliconoxide and silicon nitride in sequence and provided with a preferred ratio of silicon oxide to silicon nitride of 2:1, forming an effective thickness of about 800 to 1200 Å.

Figure 2B:
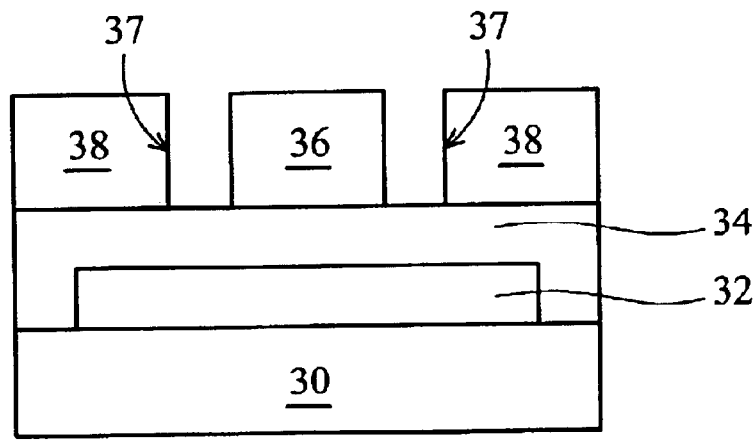

Next, as shown in FIG. 2B, a conductive layer is formed on the gate insulating layer 34, with subsequent photolithography and etching forming a gate conductive layer 36 and a dummy conductive layer 38, wherein the conductive layer is preferably made of molybdenum metal and has a preferred thickness of about 2000 to 4000 Å. The dummy conductive layer 38 is on both sides of the gate conductive layer 36 and is provided with a gap 37 therebetween, with a preferred width of 1 micron to serve as a symmetrical LDD structure. It should be noted that the positions of the LDD and the gate are defined by one photomask step, compared with the multiple steps of the prior art. The present invention saves one photomask step, avoiding alignment errors and thus improving the electrical performance of the poly-Si TFT.

Figure 2C:
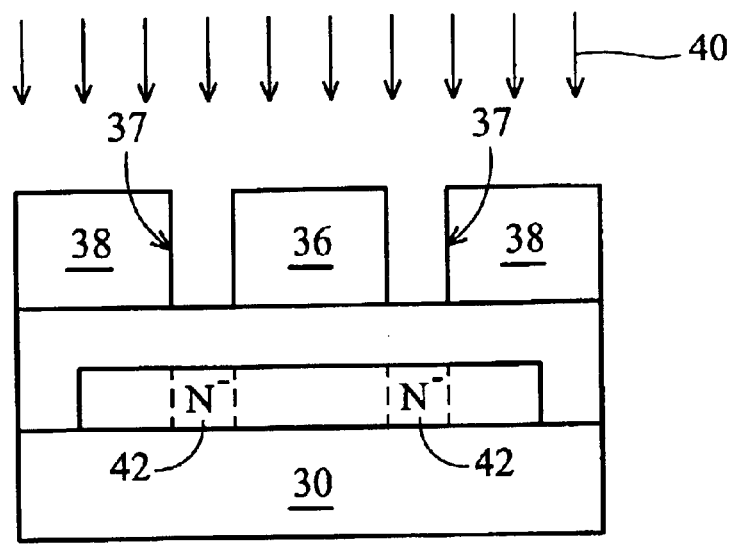

Next, as shown in FIG. 2C, N-MOS poly-Si TFT is used in a preferred embodiment. A first ion implantation process, employing P or As ions at a concentration of $1 \times 10^{13} - 1 \times 10^{14}$ $cm^{-2}$, is performed via the gap 37 to form a lightly doped region 42 and serve as an LDD structure on the semiconductor layer 32 thereunder.

Figure 2D:
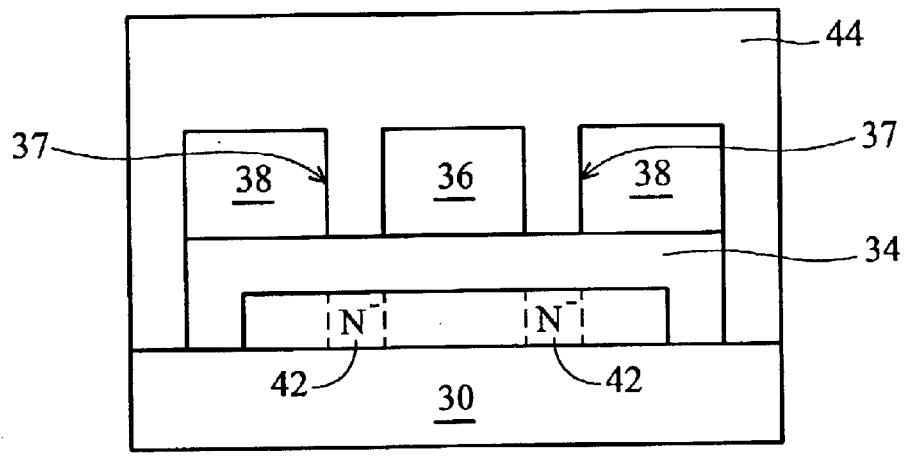

Subsequently, as shown in FIG. 2D, a sacrificial layer 44 is formed by means of spin coating to fill the gap 37 and cover gate conductive layer 36 and dummy conductive layer 38 to form a flat layer of uniform thickness, with strong adhesion and no defects. Similar to the function of positive photoresist material to protect the device of the poly-Si TFT, wherein the material is photosensitive material and, more particularly, acrylic-based organic material. The sacrificial layer 44 has a preferred thickness of about 2.5 to 3 micron above the surface of the gate insulating layer 34, wherein the deposited thickness of the sacrificial layer 44 is related to the viscosity of the organic solution on the substrate 30, also influenced by the speed of the spinner.

Figure 2E:
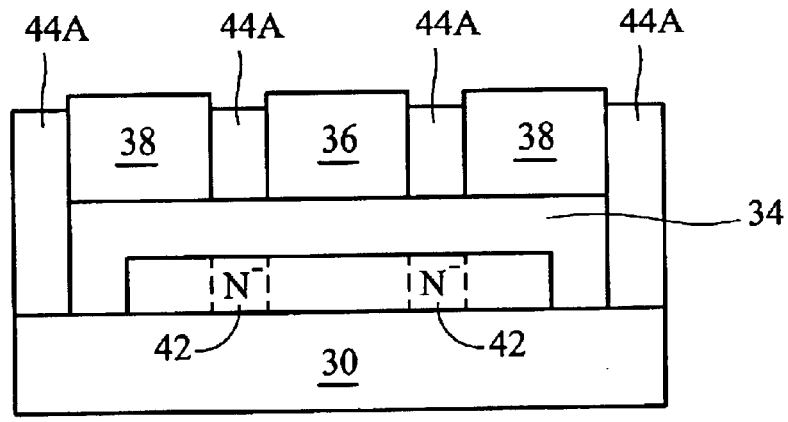

Next, as shown in FIG. 2E, partial exposure and development are performed in sequence to remove a part of the sacrificial layer 44, forming a remaining sacrificial layer 44A, thereby exposing the surface of the gate conductive layer 36 and the dummy conductive layer 38. Partial exposure is performed by means of controlling the intensity of exposure (=energy*time) to control the thickness of the sacrificial layer 44. In other words, by means of adjusting the time to change the intensity of exposure. Thus, it is ensured that the surface of the gate conductive layer 36 is formed without residue, the intensity of exposure is adjusted, slightly thinning the remaining sacrificial layer 44A compared with the gate conductive layer 36. The wavelength of light source for the exposure procedure herein is 3650 Å at what is referred to as the i-line. The light source of the exposure provides energy, to react the sacrificial layer above the gate conductive layer 36. Cleanout with developing solvent at, for example, 5 seconds, is performed more easily because of the long exposure time. The sacrificial layer 44 below the gate conductive layer 36 is unreacted with light due to the buffer from the original thickness of the sacrificial layer 44 or the shorter exposure time lead to receive a less intense exposure, therefore it is still present.

Figure 2F:
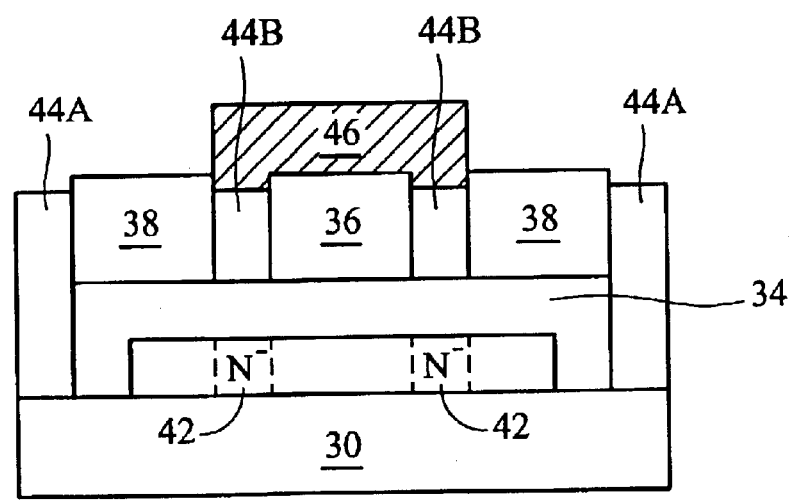

Thereafter, as shown in FIG. 2F, a patterned photoresist 46 is formed on the gate conductive layer 36 and a part of a remaining sacrificial layer 44B.

Figure 2G:
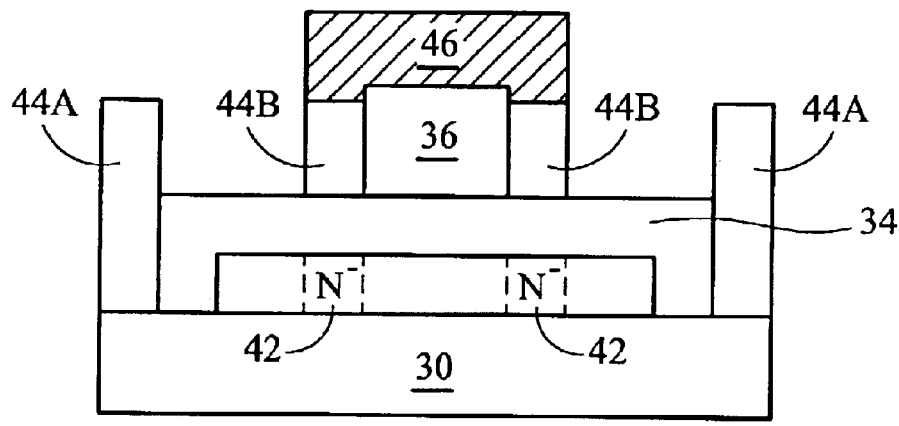

Next, as shown in FIG. 2G, wet etching is performed with the photoresist 46 as a hard mask, such that the dummy conductive layer 38 on both sides of the gate conductive layer 36 is removed, preferably with a phosphoric acid-based solution as etchant.

Figure 2H:
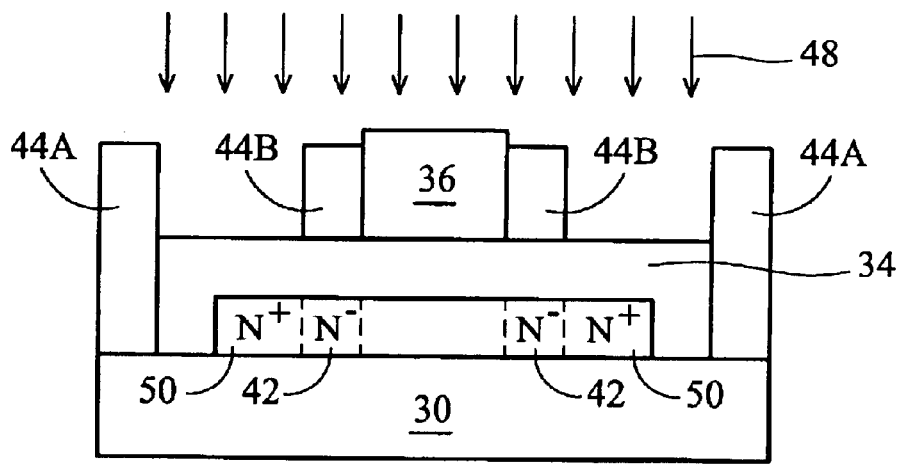

Subsequently, as shown in FIG. 2H, the photoresist 46 is removed by dry plasma method. Thereafter, a second ion implantation process is performed with the gate conductive layer 36 and a part of the remaining sacrificial layer 44B beside the gate conductive layer 36 as a hard mask, employing, for example, P ions or As ions at a concentration of $1\times10^{15}$–$1\times10^{16}$ cm$^{-2}$, performing a heavy ion implantation process 48 to form a heavily doped region 50 in the semiconductor layer 32 uncovered by the hard mask as described.

Figure 2I:
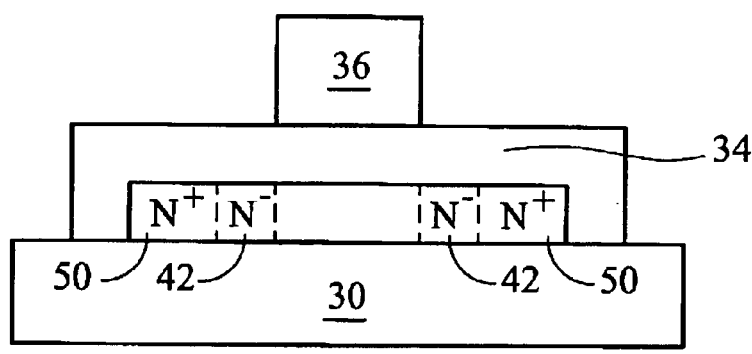

Finally, the remaining sacrificial layer 44A is removed by means of etching to form a typical N-MOS TFT structure, as shown in FIG. 2I. The structure is defined by a lightly doped region 42 serving as a self-aligned LDD structure, a heavily doped region 50 as a source/drain region, and the undoped region of the semiconductor layer 32 as a channel. The length of the channel region is generally longer than 3 microns.

Although the N-MOS TFT structure is used in the above example, the present invention is not limited thereto, the P-MOS structure can also be manufactured in accordance with the above method by those skilled in the art.

While the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of fabricating a thin film transistor (TFT) with self-aligned structure, comprising:

providing a substrate, with a semiconductor layer and gate insulation layer formed in sequence thereon;

forming a conductive layer on the gate insulation layer;

defining the conductive layer to form a gate conductive layer and a dummy conductive layer, wherein the dummy conductive layer is on both sides of the gate conductive layer and is provided with a gap therebetween;

performing a first ion implantation process via the gap to form a lightly doped region on the semiconductor layer thereunder;

forming a sacrificial layer to fill the gap;

removing the dummy conductive layer; and performing a second ion implantation process to form a heavily doped source/drain region on the semiconductor layer with the gate conductive layer and the sacrificial layer used as a mask.

2. The method according to claim 1, wherein the substrate is a transparent insulating substrate.

3. The method according to claim 2, wherein the transparent insulating substrate is made of glass.

4. The method according to claim 1, wherein the semiconductor layer is a polysilicon layer.

5. The method according to claim 1, wherein the conductive layer is a metal layer.

6. The method according to claim 5, wherein the metal layer is a molybdenum layer.

7. The method according to claim 1, wherein the gap on both sides of the gate conductive layer is substantially equal.

8. The method according to claim 1, wherein the sacrificial layer is a photosensitive material.

9. The method according to claim 8, wherein the photosensitive material is an acrylic-based organic material.

10. The method according to claim 1, wherein the sacrificial layer is formed by spin coating.

11. The method according to claim 1, wherein removal of the dummy conductive layer is performed by wet etching.

12. A method of fabricating a thin film transistor (TFT) with self-aligned structure, comprising:

providing a substrate, with a semiconductor layer and a gate insulation layer formed in sequence thereon;

forming a conductive layer on the gate insulation layer;

defining the conductive layer to form a gate conductive layer and a dummy conductive layer, wherein the dummy conductive layer is on both sides of the gate conductive layer and is provided with a gap therebetween;

performing a first ion implantation process via the gap to form a lightly doped region as a LDD structure on the semiconductor layer thereunder;

forming a sacrificial layer to fill the gap and cover the gate conductive layer and the dummy conductive layer;

performing partial exposure and development in sequence to remove a part of the sacrificial layer such that the gate conductive layer and the dummy conductive layer is exposed;

forming a patterned photoresist on the gate conductive layer and a part of the remaining sacrificial layer;

using the photoresist as a mask to remove the dummy conductive layer;

removing the photoresist layer;

performing a second ion implantation process to form a heavily doped source/drain region on the semiconductor layer using the gate conductive layer and the remaining sacrificial layer as a mask; and removing the remaining sacrificial layer.

13. The method according to claim 12, wherein the substrate is made of glass.

14. The method according to claim 12, wherein the semiconductor layer is a polysilicon layer.

15. The method according to claim 12, wherein the conductive layer is a metal layer.

16. The method according to claim 12, wherein the width of the gap on both sides of the gate conductive layer is substantially equal.

17. The method according to claim 12, wherein the sacrificial layer is an acrylic-based photosensitive organic material.

18. The method according to claim 12, wherein the sacrificial layer is formed by spin coating.

19. The method according to claim 12, wherein the thickness of the sacrificial layer is controlled by regulating the intensity of the partial exposure.

20. The method according to claim 12, wherein the dummy conductive layer is removed by wet etching.

* * * * *